US008938027B2

(12) United States Patent
Hirose et al.

(10) Patent No.: US 8,938,027 B2
(45) Date of Patent: Jan. 20, 2015

(54) DISTORTION COMPENSATION CIRCUIT, AND TRANSMISSION DEVICE USING DISTORTION COMPENSATION CIRCUIT AND HIGH-FREQUENCY POWER AMPLIFIER

(75) Inventors: Nobuo Hirose, Hino (JP); Satoshi Sakata, Kiyose (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 14/003,137

(22) PCT Filed: Mar. 12, 2012

(86) PCT No.: PCT/JP2012/056284
§ 371 (c)(1),
(2), (4) Date: Sep. 4, 2013

(87) PCT Pub. No.: WO2013/054553
PCT Pub. Date: Apr. 18, 2013

(65) Prior Publication Data
US 2013/0343484 A1    Dec. 26, 2013

(30) Foreign Application Priority Data

Oct. 13, 2011    (JP) .................................. 2011-225717

(51) Int. Cl.
*H04L 25/49*    (2006.01)
*H03F 1/32*    (2006.01)
(Continued)

(52) U.S. Cl.
CPC .............. *H03F 1/3241* (2013.01); *H03F 3/189* (2013.01); *H03F 1/3247* (2013.01); *H03F 3/245* (2013.01);
(Continued)

(58) Field of Classification Search
CPC ........... H03F 1/324; H03F 3/189; H04B 1/62; H04B 2001/0425; H04L 27/368
USPC ......................................... 375/296, 297, 285
See application file for complete search history.

(56) References Cited

U.S. PATENT DOCUMENTS

| 7,098,734 | B2 | 8/2006 | Hongo et al. |
| 7,180,368 | B2 | 2/2007 | Hirose et al. |
| 8,605,819 | B2 * | 12/2013 | Lozhkin ........................ 375/297 |
| 2005/0195030 | A1 * | 9/2005 | Okazaki et al. ............... 330/149 |
| 2006/0133536 | A1 * | 6/2006 | Rexberg ........................ 375/297 |

FOREIGN PATENT DOCUMENTS

| JP | 2005-101908 A | 4/2005 |
| JP | 2005-333353 A | 12/2005 |

(Continued)

OTHER PUBLICATIONS

Hongo et al. "A Digital Predistorter for Power Amplifier with Memory Effect," the transactions of IEICE (The Institute of Electronics, Information, and Communication Engineers) vol. J88-B, No. 10, pp. 2062-2071, Oct. 1, 2005.

(Continued)

*Primary Examiner* — Shuwang Liu
*Assistant Examiner* — David S Huang
(74) *Attorney, Agent, or Firm* — Brundidge & Stanger, P.C.

(57) ABSTRACT

In order to shorten the convergence time for compensating distortion generated by a high-frequency power amplifier, a distortion compensation circuit which independently generates coefficients of odd-symmetrical amplitude distortion compensation signals and coefficients of odd-symmetrical phase distortion compensation signals of respective orders of a high-frequency power amplifier includes an even-symmetrical distortion compensation signal generation circuit for generating an even-symmetrical amplitude distortion compensation signal and an even-symmetrical phase distortion compensation signal from a difference between the input signal amplitude and a signal obtained by delaying the input signal amplitude and a difference between the input signal and a signal obtained by delaying the input signal, respectively independently and independently of the odd-symmetrical distortion compensation signals, and an even-symmetrical distortion compensation signal superposition circuit for superposing the even-symmetrical distortion compensation signals on the input signal, and conducts pre-compensation on odd-symmetrical distortion and even-symmetrical distortion independently.

4 Claims, 7 Drawing Sheets

(51) Int. Cl.
*H03F 3/189* (2006.01)
*H03F 3/24* (2006.01)
*H04L 27/36* (2006.01)
*H03C 1/06* (2006.01)
*H04B 1/04* (2006.01)

(52) U.S. Cl.
CPC ............... *H03F 1/3258* (2013.01); *H03F 3/24* (2013.01); *H04L 27/368* (2013.01); *H03C 1/06* (2013.01); *H03F 2200/336* (2013.01); *H04B 2001/0425* (2013.01)
USPC .......................................... 375/297; 375/285

(56) References Cited

FOREIGN PATENT DOCUMENTS

| | | |
|---|---|---|
| JP | 2008-294518 A | 12/2008 |
| JP | 2009-219167 A | 9/2009 |
| JP | 2010-068142 A | 3/2010 |
| WO | 2004/045067 A1 | 5/2004 |

OTHER PUBLICATIONS

International Search Report from International application No. PCT/JP2012/056284 mailed Jun. 5, 2012.

* cited by examiner

TABLE 1 AVERAGE VALUES OF $n$TH POWERS OF AMPLITUDE WHICH ASSUMES GAUSS DISTRIBUTION

| n | AVERAGE VALUE OF $n$TH POWER OF AMPLITUDE |
|---|---|
| 1 | 0 |
| 2 | 1 |
| 3 | 0 |
| 4 | 3 |
| 5 | 0 |
| 6 | 15 |
| 7 | 0 |
| 8 | 105 |
| 9 | 0 |
| 10 | 945 |

DISTORTION COMPENSATION CIRCUIT, AND TRANSMISSION DEVICE USING DISTORTION COMPENSATION CIRCUIT AND HIGH-FREQUENCY POWER AMPLIFIER

TECHNICAL FIELD

The present invention relates to distortion compensation for reducing distortion components which are output from a transmission apparatus for transmitting a radio wave power—amplified by a high-frequency power amplifier.

BACKGROUND ART

The OFDM (Orthogonal Frequency Division Multiplexing) modulation technique (hereafter referred to as OFDM technique) and the QAM (Quadrature Amplitude Modulation) technique are adopted in terrestrial digital broadcasting or the like. A modulation signal in the terrestrial digital broadcasting is formed of construction unit periods.

As an example of the conventional pre-compensation technique for nonlinear distortion, especially the technique of independent compensation for odd-order distortion, there is a technique described in Patent Literature 1. As the band of the signal becomes broad, the so-called memory effect in which distortion increases due to influence of the signal in the past becomes remarkable in general in a high-frequency power amplifier and hysteresis characteristics and even-symmetric distortion increases. And the circuit scale for the predistortion compensation becomes large. Therefore, a method for reducing the circuit scale of predistortion compensation which becomes large due to the memory effect of the high-frequency power amplifier is proposed in Non-Patent Literature 1. A predistortion compensation technique using an even-order time difference is disclosed in Patent Literature 2. A predistortion compensation technique using the amplitude differential and phase differential is disclosed in Patent Literature 3.

In the techniques described in Patent Literature 2 and Patent Literature 3, there is a drawback that it takes a time for the pre-compensation for reducing the memory effect to converge.

CITATION LIST

Patent Literatures

Patent Literature 1: WO2004/045067
Patent Literature 2: JP-A-2005-101908
Patent Literature 3: JP-A-2008-294518

Non-Patent Literatures

Non-Patent Literature 1: (Naoki HONGO, Tetsuhiko MIYATANI, Yoichi OKUBO, and Yoshihiko AKAIWA, "A Digital Predistorter for Power Amplifier with Memory Effect," the transactions of MICE (The Institute of Electronics, Information, and Communication Engineers), Vol. J88-B, No. 10, pp. 2062-2071, Oct. 1, 2005).

SUMMARY OF INVENTION

Technical Problem

An object of the present invention is to shorten the convergence time for compensating distortion generated by the high-frequency power amplifier.

Solution to Problem

In order to achieve the object, the present invention provides a distortion compensation circuit including a distortion compensation signal generation circuit for independently generating odd-symmetrical distortion compensation signals of respective orders of a high-frequency power amplifier which power-amplifies an input signal frequency-converted into a high-frequency band or an input signal in the high-frequency band, a distortion compensation signal superposition (multiplier or adder) circuit for superposing (by multiplying or adding) the generated odd-symmetrical distortion compensation signals of respective orders on the input signal obtained before the frequency conversion to the high frequency band or the input signal in the high frequency band (hereafter referred to as the input signal), an even-symmetrical distortion compensation signal generation circuit for generating a plurality of even-symmetrical distortion compensation signals from a difference (differential) between the input signal and a signal obtained by delaying the input signal, respectively independently and independently of the odd-symmetrical distortion compensation signals and conducting linear combination on the plurality of generated even-symmetrical distortion compensation signals, and an even-symmetrical distortion compensation signal superposition (multiplier or adder) circuit for superposing (by multiplying or adding) the even-symmetrical distortion compensation signals subjected to the linear combination on the input signal, odd-symmetrical distortion and even-symmetrical distortion being compensated independently.

Furthermore, the present invention provides a distortion compensation circuit including a distortion compensation signal generation circuit for independently generating coefficients of odd-symmetrical distortion compensation signals of respective orders of a high-frequency power amplifier which power-amplifies an input signal frequency-converted into a high-frequency band or an input signal in the high-frequency band, a distortion compensation signal superposition (multiplier or adder) circuit for superposing (by multiplication or addition) the generated odd-symmetrical distortion compensation signals of respective orders on the input signal obtained before the frequency conversion to the high frequency band or the input signal in the high frequency band (hereafter referred to as the input signal), an even-symmetrical distortion compensation signal generation circuit for obtaining a difference (approximate differential) between amplitude (an absolute value of a complex number) of the input signal and that obtained one sample before, (multiplying the difference by a coefficient to make rms=1, and multiplying a result by the input signal to generate a first signal), obtaining a difference between the input signal and that obtained one sample before, (multiplying the difference by a coefficient for making rms=1, multiplying a result by magnitude of a difference signal contained in the signal to generate a second signal, adding the first signal and the second signal to generate pure even-symmetrical distortion, multiplying the even-symmetrical distortion by a real component of a coefficient detected by the even-symmetrical distortion compensation signal generation circuit to generate an even-symmetrical amplitude distortion signal, multiplying the even-symmetrical distortion by an imaginary component of the coefficient to generate an even-symmetrical phase distortion signal, conducting linear combination on the even-symmetrical amplitude distortion signal and the even-symmetrical phase distortion signal) and thereby generating an even-symmetrical amplitude distortion compensation signal and an even-symmetrical phase distortion compensation signal on the basis of the difference (differential) between the amplitude of the input signal and that obtained one sample before and the difference between the input signal and that obtained one sample before, respectively independently and independently of the odd-symmetrical distortion compensation signals, and an even-symmetrical distortion compensation signal superposition (multiplier or adder) circuit for superposing (by conducting multiplication or addition) the generated even-symmetrical distortion compensation signals on the input signal, odd-symmetrical distortion and even-symmetrical distortion being compensated independently.

In addition, the present invention provides a transmitter using the above-described distortion compensation circuit and high-frequency power amplifier.

Advantageous Effects of Invention

According to the present invention, it becomes possible to shorten the convergence time for compensating distortion generated by the power amplifier by compensating odd symmetrical distortion and even symmetrical distortion independently, as described heretofore.

DESCRIPTION OF EMBODIMENTS

Hereafter, the present invention will be described. First, distortion will now be described. A distortion-less signal to be amplified by a power amplifier is represented by Expression 1 as a function of amplitude and phase.

[Expression 1]

$$\text{Input signal} = A(t) \cdot \exp(j \cdot \theta(t)) \quad (3.1)$$

Supposing that the root means square (hereafter abbreviated to rms) of Expression 1 is 1 and the rms of a signal dA(t) obtained by differentiating A(t) is 1, even-symmetrical distortion IMeven can be represented by Expression 2.

[Expression 2]

$$IMeven = dA(t) \cdot A(t) \cdot \exp(j \cdot \theta(t)) \quad (3.2)$$

In the OFDM signal, the amplitude probability density of $A(t) \cdot \exp(j \cdot \theta(t))$ in Expression 1 assumes Rayleigh distribution.

A result obtained by calculating magnitude η21 of the differentiated signal contained in Expression 2 according to Expression 3 by means of simulation is approximately 0.6378.

[Expression 3]

$$\eta 21 = \overline{dA(t) \cdot A(t) \cdot \exp(j \cdot \theta(t)) \cdot conj\{(A(t) \cdot \exp(j \cdot \theta(t))'\}} \approx 0.6378 \quad (3.3)$$

Here, it is supposed that rms of A(t) is 1, rms of $A(t) \cdot \exp(j \cdot \theta(t))$ is 1, $(A(t) \cdot \exp(j \cdot \theta(t)))'$ is a differential value of $A(t) \cdot \exp(j \cdot \theta(t))$, and conj means a conjugate complex number. Expression 4 is obtained from Expression 2 and Expression 3.

[Expression 4]

$$IMeven = dA(t) \cdot A(t) \cdot \exp(j \cdot \theta(t)) - 0.6378(A(t) \cdot \exp(j \cdot \theta(t)))' \quad (3.4)$$

The rms in Expression 4 is found to be approximately 0.7996 by simulation, Normalizing by rms=1, Expression 5 is obtained.

[Expression 5]

$$IMeven = \frac{dA(t) \cdot A(t) \cdot \exp(j \cdot \theta(t)) - 0.6378(A(t) \cdot \exp(j \cdot \theta(t)))'}{0.7996} \quad (3.5)$$

A method for calculating the even-symmetrical distortion coefficients will now be described. As for magnitudes of odd-symmetrical distortions and even-symmetrical distortions generated by the power amplifier, it is supposed that the magnitude is a3 for the third-order amplitude distortion, b3 for the third-order phase distortion, a5 for the fifth-order amplitude distortion, b5 for the fifth-order phase distortion, •••, a25 for the twenty-fifth-order amplitude distortion, b25 for the twenty-fifth-order phase distortion, a2 for even-symmetrical amplitude distortion, and b2 for even-symmetrical phase distortion. At this time, an output signal pa_out of the power amplifier can be represented by Expression 6.

[Expression 6]

$$pa\_out = A(t) \cdot \exp(j \cdot \theta(t)) + a3 \cdot IM3 + a5 \cdot IM5 + \\ \cdots a25 \cdot IM25 + a2 \cdot IMeven + j(b3 \cdot IM3 + b5 \cdot IM5 + \\ \cdots b25 \cdot IM25 + b2 \cdot IMeven) \quad (4.1)$$

Here, IMeven is supposed to be represented by Expression 2 to simplify the calculation. Subtracting a distortion-less signal from the output signal of the power amplifier, an error signal err is represented by Expression 7.

[Expression 7]

$$err = a3 \cdot IM3 + a5 \cdot IM5 + \cdots a25 \cdot IM25 + a2 \cdot IMeven + j \\ (b3 \cdot IM3 + b5 \cdot IM5 + \cdots b25 \cdot IM25 + b2 \cdot IMeven) \quad (4.2)$$

Multiplying Expression 7 by a conjugate complex number of IMeven and averaging a result, Expression 8 is obtained.

[Expression 8] (4.3)

$$a3 \cdot \overline{IM3} \cdot dA(t) \cdot \exp(-i \cdot \theta(t))$$

$$a5 \cdot \overline{IM5} \cdot dA(t) \cdot \exp(-i \cdot \theta(t))$$

$$\vdots$$

$$a25 \cdot \overline{IM25} \cdot dA(t) \cdot \exp(-i \cdot \theta(t))$$

$$a2 \cdot \overline{dA(t) \cdot \exp(i \cdot \theta(t))} \cdot dA(t) \cdot \exp(-i \cdot \theta(t))$$

$$jb3 \cdot \overline{IM3} \cdot dA(t) \cdot \exp(-i \cdot \theta(t))$$

$$jb5 \cdot \overline{IM5} \cdot dA(t) \cdot \exp(-i \cdot \theta(t))$$

$$\vdots$$

$$jb25 \cdot \overline{IM25} \cdot dA(t) \cdot \exp(-i \cdot \theta(t))$$

$$jb2 \cdot \overline{dA(t) \cdot \exp(i \cdot \theta(t))} \cdot dA(t) \cdot \exp(-i \cdot \theta(t))$$

Figure 4:
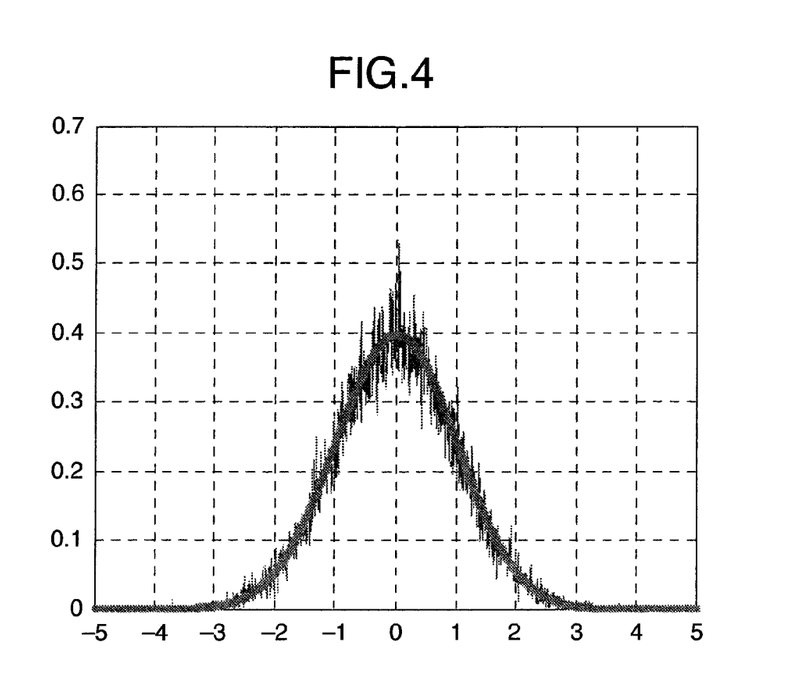
FIG. 4 is a schematic diagram of an amplitude probabilistic density (when rms=1) of a differential value of amplitude which assumes Rayleigh distribution.
Figure 5:
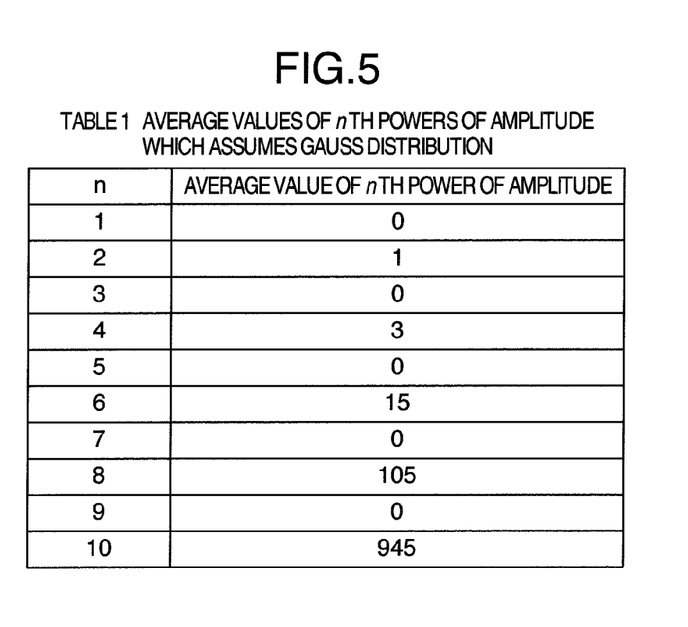
FIG. 5 is TABLE 1 showing average values of powers of amplitude which assumes Gauss distribution with rms=1.

An amplitude probability density of a differential value dA(t) of A(t) which assumes the Rayleigh distribution assumes Gauss distribution as shown in FIG. 4. Furthermore, average values of powers of amplitude which assumes Gauss distribution with rms=1 are put together in TABLE 1 shown in FIG. 5. As apparent from TABLE 1 shown in FIG. 5, the average value of dA(t) becomes 0, and consequently a3 to a25 and b3 to b25 in Expression 8 are also detected as 0. On the other hand, the rms of dA(t) is designed to be 1, and consequently the average value of $dA^2(t)$ is also 1 (see TABLE 1). As a result, only a2 and b2 are detected from Expression 8. In other words, it is appreciated that the even-symmetrical amplitude distortion coefficient (a2) and the odd-symmetrical phase coefficient (b2) can be detected independently of the odd-symmetrical distortion.

Furthermore, according to the present technique, it becomes possible to detect coefficients (magnitudes) of odd-symmetrical distortion and even-symmetrical distortion respectively independently, and in addition it becomes possible to superpose (add or multiply) distortion compensation signals respectively independently and conduct compensation. As a result, convergence is attained in a short time.

First Embodiment

Figure 1A:
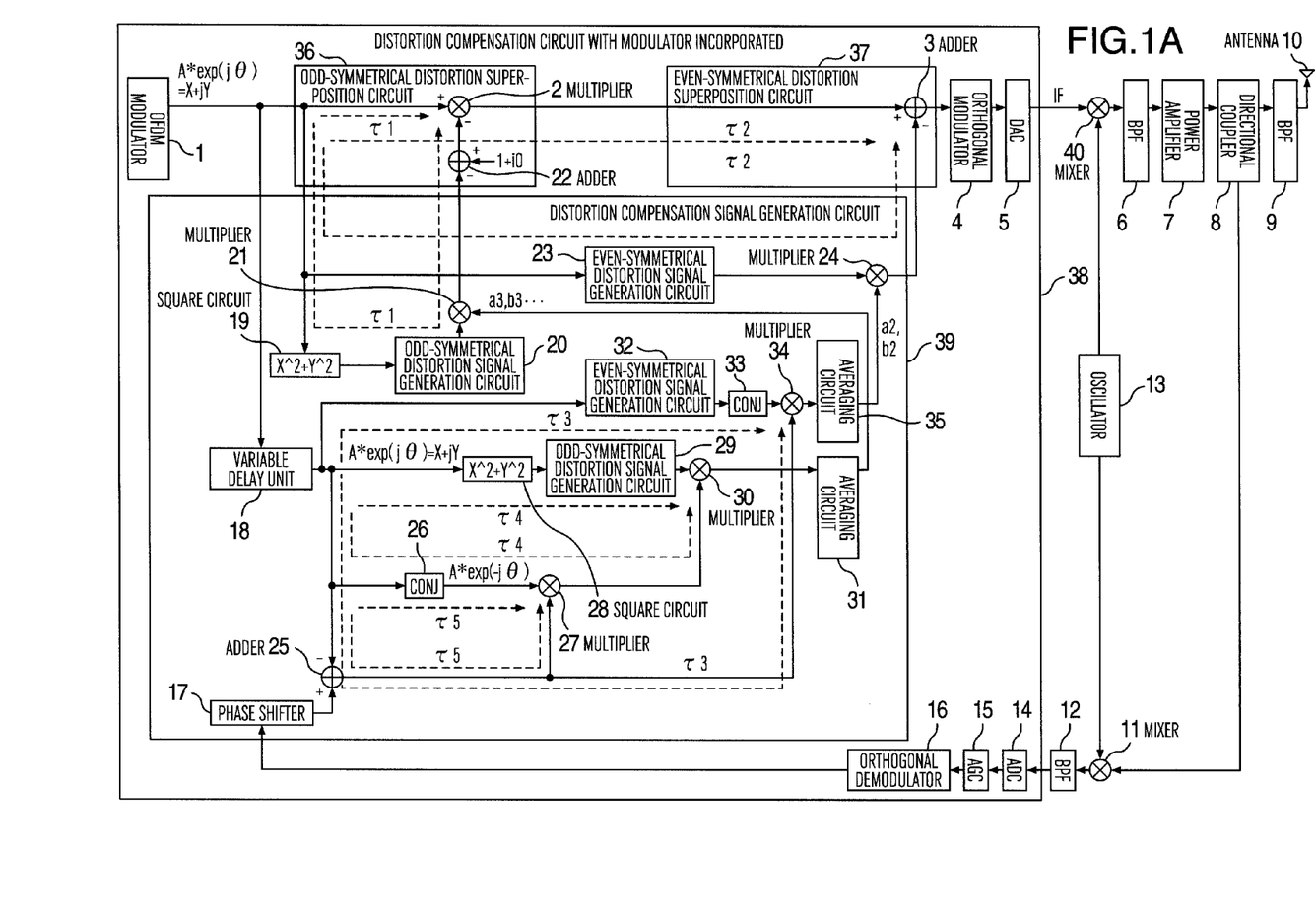
FIG. 1A is a block diagram showing a transmitter according to an embodiment of the present invention (with an OFDM modulator incorporated).

Configurations and operations of an embodiment of the present invention will now be described with reference to FIG. 1A, which is a block diagram (with an OFDM modulator incorporated) showing a transmitter according to an embodiment of the present invention, FIG. 1B, which is a block diagram (with an OFDM modulator provided externally) showing a transmitter according to an embodiment of the present invention, FIG. 2A, which is a block diagram (with amplitude differential and phase differential) showing an odd symmetry distortion signal generation circuit according to an embodiment of the present invention, and FIG. 2B, which is a block diagram (with automatic coefficient calculation) showing an odd symmetry distortion signal generation circuit according to an embodiment of the present invention.

In the first embodiment, a difference (approximate differential) between amplitude of an input signal (an absolute value of a complex number) and that obtained one sample before is obtained. The difference is multiplied by a coefficient for making rms=1. A resultant signal is multiplied by the input signal to generate a first signal. The first signal contains differential of the input signal which is an unnecessary signal. Therefore, a signal of a difference between the input signal and that obtained one sample before is multiplied by a coefficient for making rms=1. In addition, magnitude of a difference signal contained in the signal is multiplied to generate a second signal. Pure even-symmetrical distortion can be generated by adding the second signal to the first signal. An even-symmetrical amplitude distortion signal is generated by multiplying the even-symmetrical distortion signal by a real component of a coefficient detected in an even-symmetrical distortion compensation signal generation circuit. An even-symmetrical phase distortion signal is generated by multiplying the even-symmetrical distortion signal by an imaginary component of the coefficient. Inverse characteristic of the memory effect is approximated by linear combination of them.

A digital input signal which is output from an OFDM modulator 1 contained in a distortion compensation circuit 38 with modulator incorporated is input to a multiplier 2 and a variable delay unit 18. The input signal subjected to suitable delay adjustment in the variable delay unit 18 is input to a distortion compensation signal generation circuit 39. An output signal of the multiplier 2 is input to an adder 3. An output signal of the adder 3 is modulated by an orthogonal modulator 4, converted to an analog signal in a DAC 5, then output from the distortion compensation circuit 38, subjected to frequency conversion in a mixer 40 and an oscillator 13, cleared of unnecessary waves in a BPF 6, and power-amplified to a predetermined level in a high-frequency power amplifier (power amplifier) 7. An output signal which is output from the power amplifier 7 is transmitted from an antenna 10 as a radio wave via a directional coupler 8 and a BPF 9.

On the other hand, a signal obtained by distribution in the directional coupler 8 is subjected to frequency conversion using a mixer 11 and an oscillator 13, cleared of unnecessary waves in a BPF 12, and then input to the distortion compensation circuit 38 with modulator incorporated. The signal which is input is converted to a digital signal by an A/D converter (ADC) 14. The converted signal is subjected to gain adjustment in a variable amplifier (AGC) 15 to yield a signal having a suitable level, and a resultant signal is demodulated in an orthogonal demodulator 16. Then, a resultant signal is adjusted in a phase shifter 17 to have suitable phase characteristics, and input to the distortion compensation signal generation circuit 39.

At this time, the variable delay unit 18 conducts adjustment to make delay times of two signals which are input to the distortion compensation signal generation circuit 39 equal to each other, whereas the phase shifter 17 conducts adjustment to make phases of the two signals which are input to the distortion compensation signal generation circuit 39 equal to each other.

On the basis of the two signals which are input, the distortion compensation signal generation circuit 39 detects respective coefficients (magnitudes) of third-order distortion (A3) to seventh-order distortion (A7) of amplitude which are odd-symmetrical, third-order distortion (P3) to seventh-order distortion of phase which are symmetrical, second-order distortion (A2) of amplitude which is even-symmetrical, and second-order distortion (P2) of phase, independently. On the basis of the coefficients, an odd-symmetrical distortion superposition (multiplication) circuit 36 and an even-symmetrical distortion superposition (addition) circuit 37 adds a distortion compensation signal. Odd-symmetrical distortion coefficient detection and odd-symmetrical distortion addition are the same as those described in Patent Literature 1. Therefore, detailed description of the odd-symmetrical distortion coefficient detection and odd-symmetrical distortion addition will be omitted, and they will be described briefly. And description will be made stressing upon even-symmetrical distortion coefficient detection and even-symmetrical distortion addition.

Hereafter, the odd-symmetrical distortion coefficient detection conducted in the distortion compensation signal generation circuit 39 will be described. A square circuit 28 converts an output signal of the variable delay unit 18 to a real signal which is an absolute value square signal of a complex number signal. An odd-symmetrical distortion signal generation circuit 29 generates an odd-symmetrical distortion signal on the basis of the real signal.

Furthermore, a conjugation unit (CONJ) 26 converts the output signal of the variable delay unit 18 to a signal of a conjugate complex number. A multiplier 27 multiplies the resultant signal by a distortion (a difference between the input and a fed back signal) signal which is output from an adder 25. A multiplier 30 multiplies an output signal of the multiplier 27 by an output signal of the odd-symmetrical distortion signal generation circuit 29. An averaging circuit 31 averages a resultant signal. As a result, the averaging circuit 31 outputs a signal of the third-order to seventh-order odd-symmetrical amplitude distortion coefficients A3 to A7 (real components) and the third-order to seventh-order odd-symmetrical phase distortion coefficients P3 to P7 (imaginary components) of a distortion (difference between the input and a fed back signal) signal of the output.

Odd-symmetrical distortion addition conducted in the odd-symmetrical distortion superposition circuit 36 will now be described. A square circuit 19 converts the digital input signal to a real signal of an absolute value square signal of a complex number signal. An odd-symmetrical distortion signal generation circuit 20 generates an odd-symmetrical distortion signal on the basis of the real signal. A multiplier 21 multiplies the odd-symmetrical distortion signal by the signal of the coefficients A3 to A7 and P3 to P7 of a distortion (difference between the input and a fed back signal) signal which is output from the averaging circuit 31. An adder 22 subtracts an output signal of the multiplier 21 which is a complex number signal from 1. As a result, conversion to an inverse characteristic with respect to the characteristic of the power amplifier is conducted. The multiplier 2 multiplies a resultant signal by the digital input signal which is the OFDM signal. As a result, the multiplier 2 outputs a signal with odd-symmetrical inverse distortion superposed.

Detection of the even-symmetrical amplitude second-order distortion (A2) and even-symmetrical phase second-order distortion (P2) conducted in the distortion compensation signal generation circuit 39 will now be described. An even-symmetrical distortion signal generation circuit 32 generates an even-symmetrical second-order distortion signal on the basis of the output signal of the variable delay unit 18. A CONJ 33 converts the even-symmetrical second-order distortion signal to a signal of a conjugate complex number. A multiplier 34 multiplies the resultant signal by the distortion (a difference between the input and a fed back signal) signal which is output from the adder 25. An averaging circuit 35 averages a resultant signal. As a result, the averaging circuit 35 outputs a signal of the amplitude second-order distortion coefficient A2 which is even-symmetrical and the phase second-order distortion coefficient P2 which is even-symmetrical.

The even-symmetrical distortion addition conducted in the even-symmetrical distortion superposition circuit 37 will now be described. An even-symmetrical distortion signal generation circuit 23 calculates an even-symmetrical second-order distortion of the digital input signal. And a multiplier 24 multiplies the even-symmetrical second-order distortion by the signal of the coefficients A2 and P2 of the distortion (the difference between the input and the fed back signal) signal which is output from the averaging circuit 35, and generates an amplitude second-order distortion signal and a phase second-order distortion signal based on the distortion coefficients. The adder 3 adds the output signal of the multiplier 24 to the signal with odd-symmetrical inverse distortion superposed which is the OFDM signal, and outputs a signal with even-symmetrical inverse distortion added.

It is also possible to replace the even-symmetrical distortion signal generation circuit 32 with a variable delay unit having a delay quantity of a certain value, delay the output of the even-symmetrical distortion signal generation circuit 23, and input the delayed output to the conjugation unit (COM) 33. It is also possible to replace the odd-symmetrical distortion signal generation circuit 29 with a variable delay unit having a certain value, delay the output of the odd-symmetrical distortion signal generation circuit 20, and input the delayed output to the multiplier 30.

Even-symmetrical distortion generation will now be described with reference to FIG. 2A which is a block diagram showing an even symmetrical distortion generation circuit according to an embodiment of the present invention. An absolute value generation circuit 51 converts an input signal to a real signal of an absolute value of a complex number signal. A delay unit (D) 52 and an adder 54 generate a difference (approximate differential) output between the real signal obtained by the conversion and that obtained one sample before. An effective value reciprocal calculation circuit 62 calculates a reciprocal of an effective value of the real signal obtained by the conversion. A multiplier 56 multiplies the reciprocal of the effective value by the difference output of the adder 54. In addition, a multiplier 58 multiplies the input signal by an output of the multiplier 56. Since the above-described signal contains an unnecessary signal (a differential signal of the input signal) as well, it is necessary to remove that signal component. Therefore, a delay unit (D) 53 and an adder 55 generate a difference (approximate differential) output between the input signal and that obtained one sample before. In addition, an effective value reciprocal calculation circuit 63 calculates a reciprocal of an effective value of the input signal. A multiplier 57 multiplies the reciprocal of the effective value by the difference output of the adder 55. A multiplier 59 multiplies a resultant signal by a coefficient 0.6378 (magnitude of the differential value of the input signal contained in an output signal of the multiplier 58). An adder 60 adds the output of the multiplier 58 to an output of the multiplier 59, and outputs an even-symmetrical distortion signal due to the memory effect.

Figure 1B:
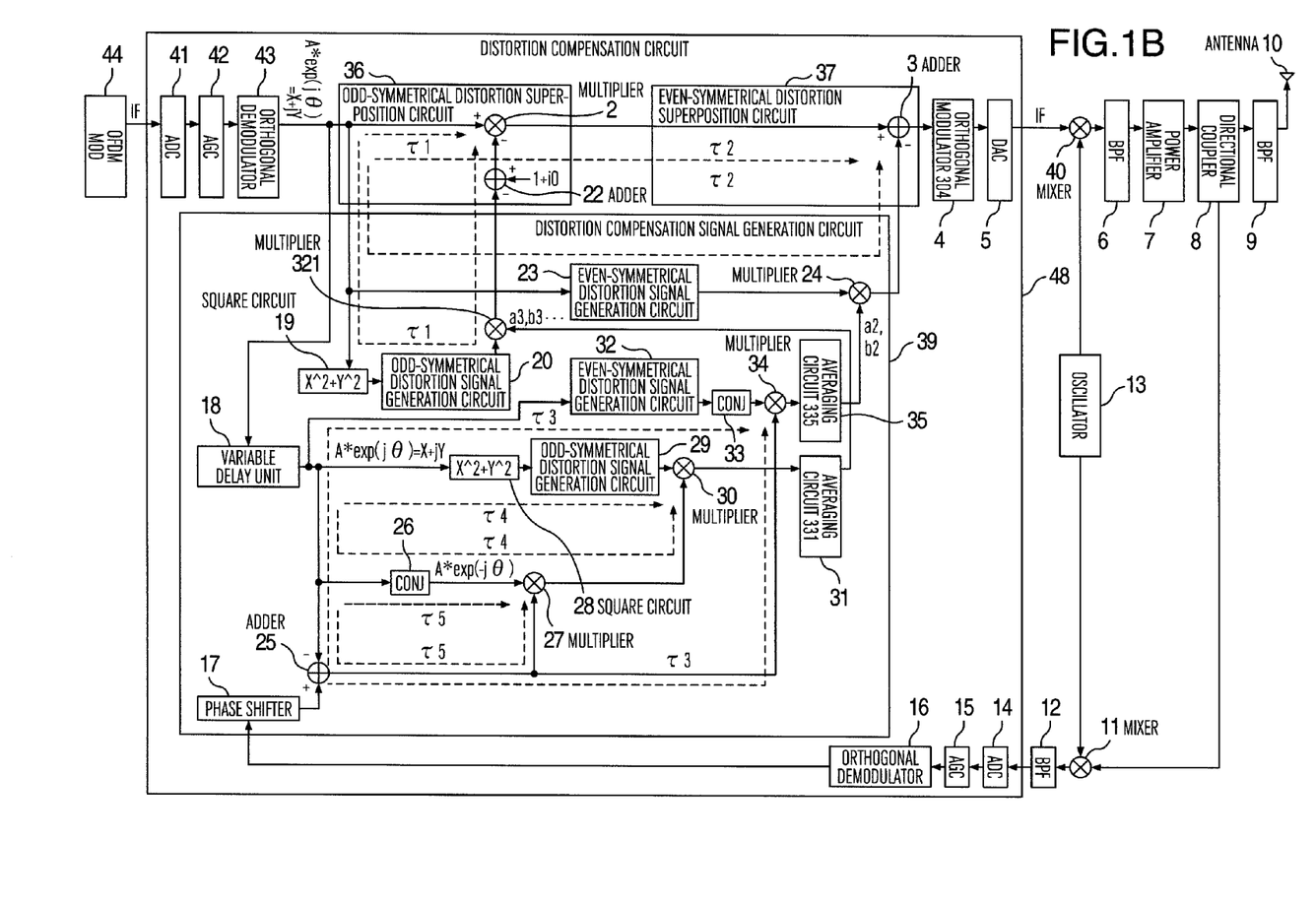
FIG. 1B is a block diagram showing a transmitter according to an embodiment of the present invention (with an OFDM modulator provided externally).
Figure 1C:
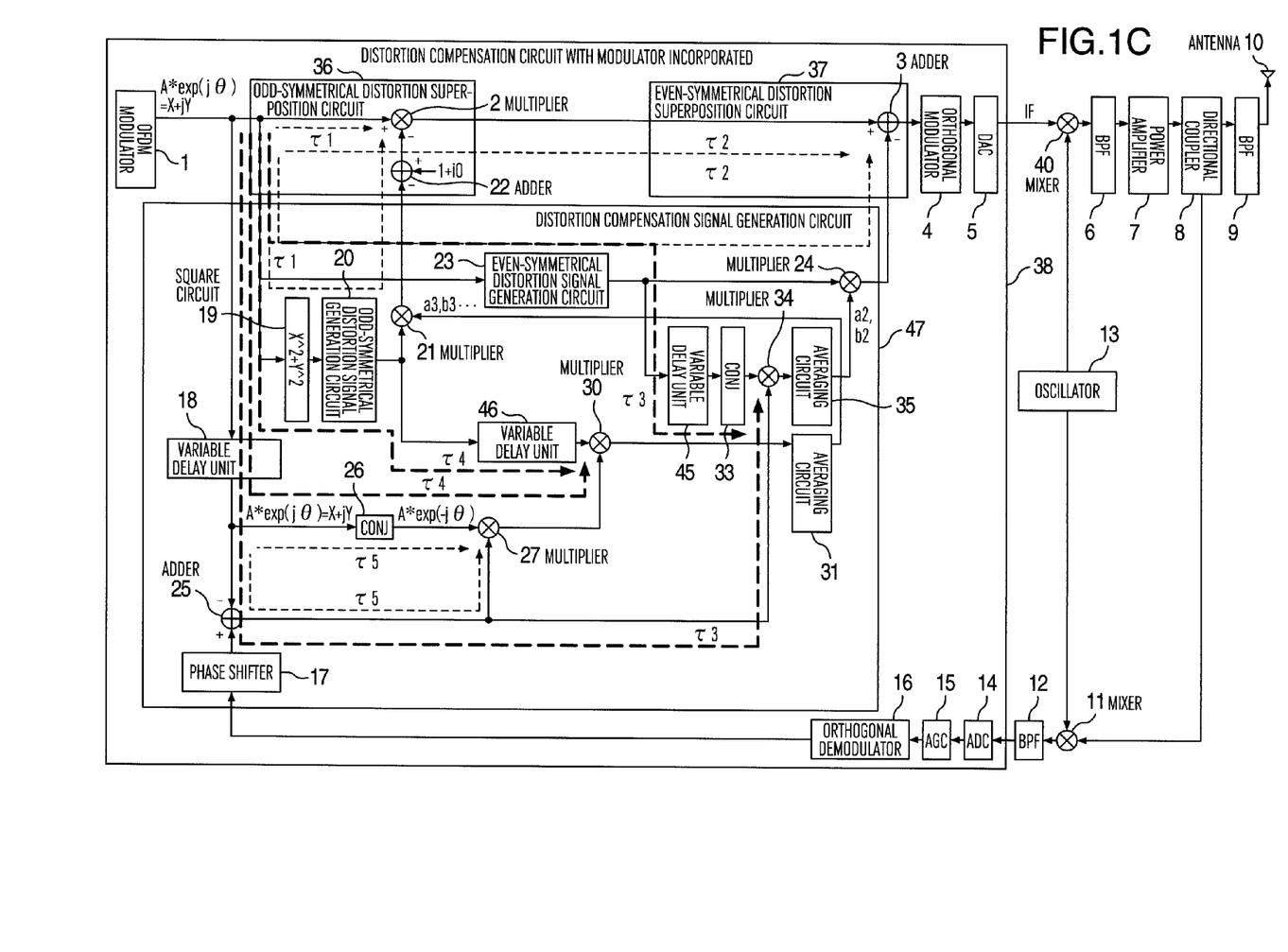
FIG. 1C is a block diagram showing a transmitter according to an embodiment of the present invention (with only one even symmetrical distortion signal generation circuit and only one even-symmetrical distortion generation circuit).

In FIG. 1B which is a block diagram (with OFDM modulator provided externally) showing a transmitter according to an embodiment of the present invention, an OFDM modulator (OFDM-MOD, which provides an analog output) 44 is provided externally to a distortion compensation circuit 48, and an A/D converter (ADC) 41, a variable amplifier (AGC) 42, and an orthogonal demodulator 43 are added. Since other configurations and operations are the same as those in FIG. 1A, description of them will be omitted and only differences will be described.

An analog input signal which is output from the OFDM modulator (OFDM-MOD, which provides an analog output) 44 is input to the distortion compensation circuit 48 according to the present invention. The ADC 41 converts the input signal to a digital signal. The AGC 42 conducts gain adjustment on the digital signal obtained by the conversion to output a signal having a suitable level. In addition, the orthogonal demodulator 43 demodulates the signal to obtain a signal in a baseband.

Second Embodiment

A second embodiment will now be described with reference to FIG. 3 which is a block diagram (with square added) showing an odd-symmetrical distortion signal generation circuit according to an embodiment of the present invention. Description of configurations and operations which are the same as those in the first embodiment will be omitted and only differences will be described. There are also high-frequency power amplifiers satisfied with the first embodiment. Depending upon the high-frequency power amplifier, however, distortion is reduced by detecting high-order even-symmetrical distortion and conducting compensation as in the second embodiment.

Figure 2A:
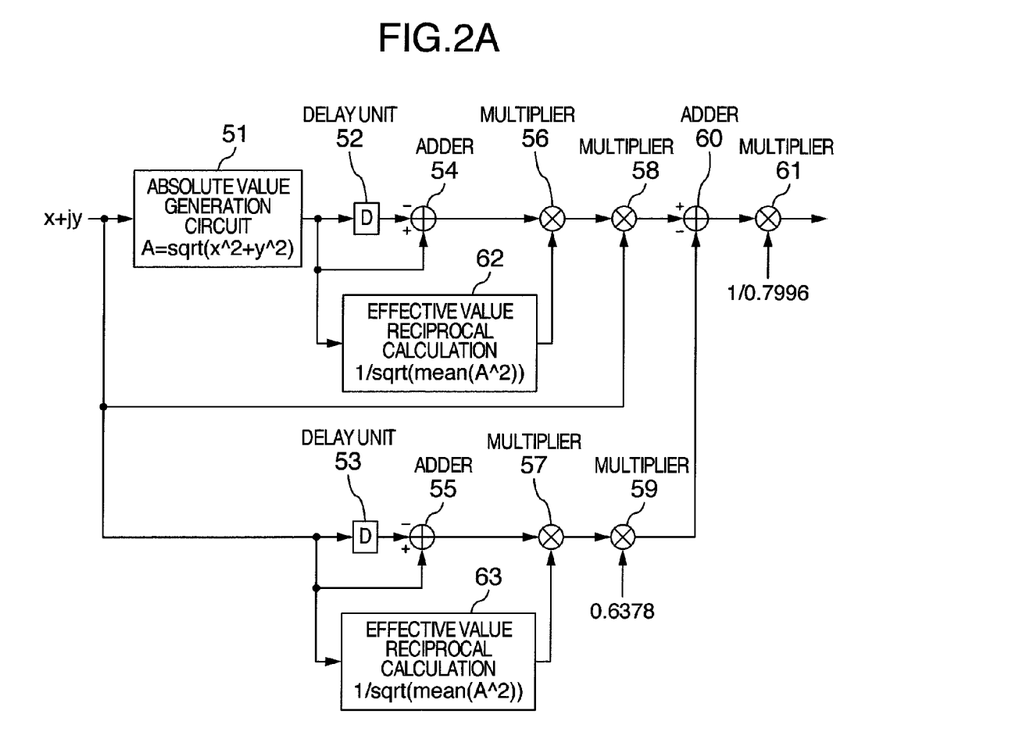
FIG. 2A is a block diagram showing an even symmetry distortion signal generation circuit according to an embodiment of the present invention (with amplitude differential and phase differential).
Figure 2B:
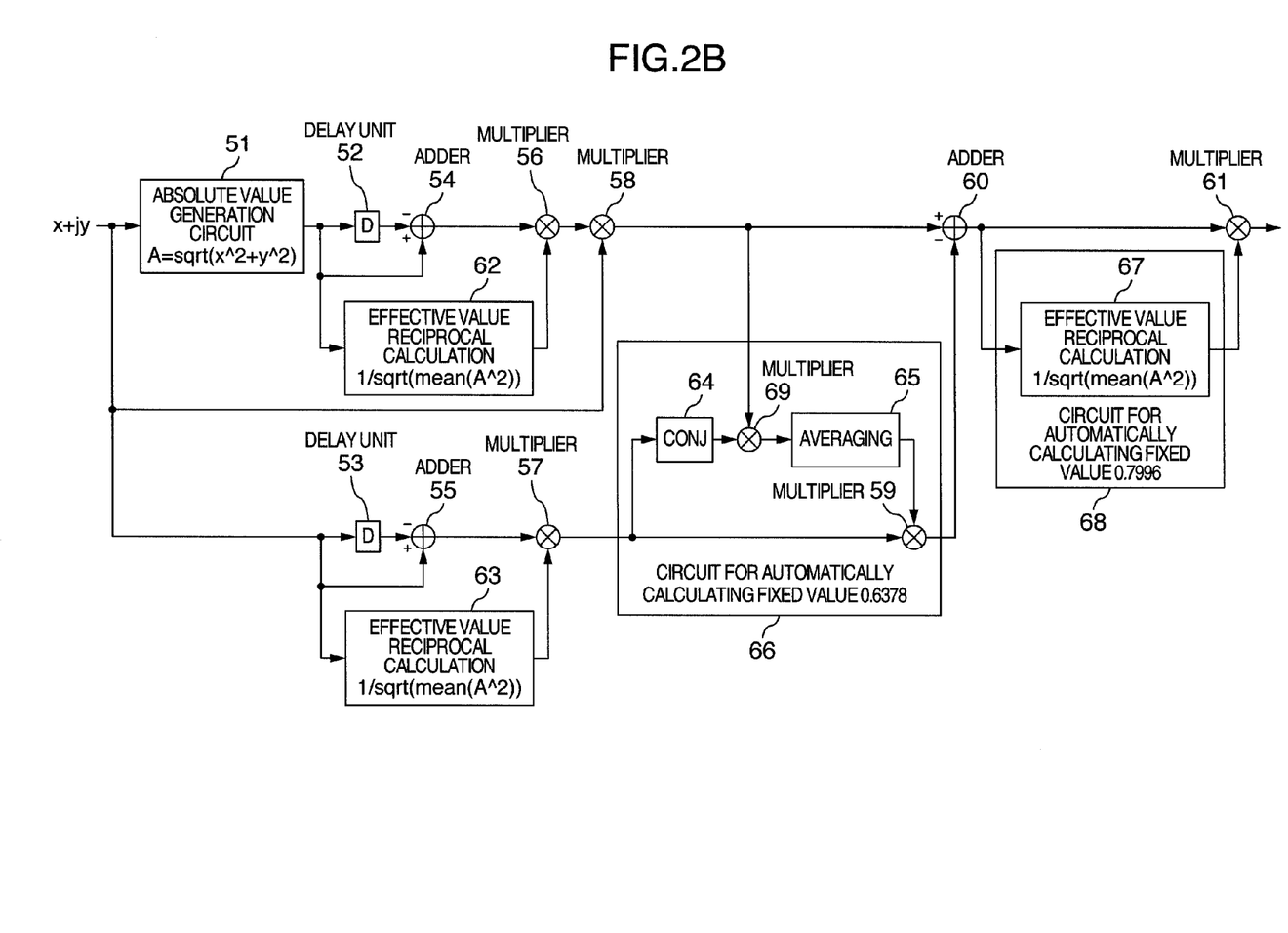
FIG. 2B is a block diagram showing an even symmetry distortion signal generation circuit according to an embodiment of the present invention (with automatic coefficient calculation).
Figure 3:
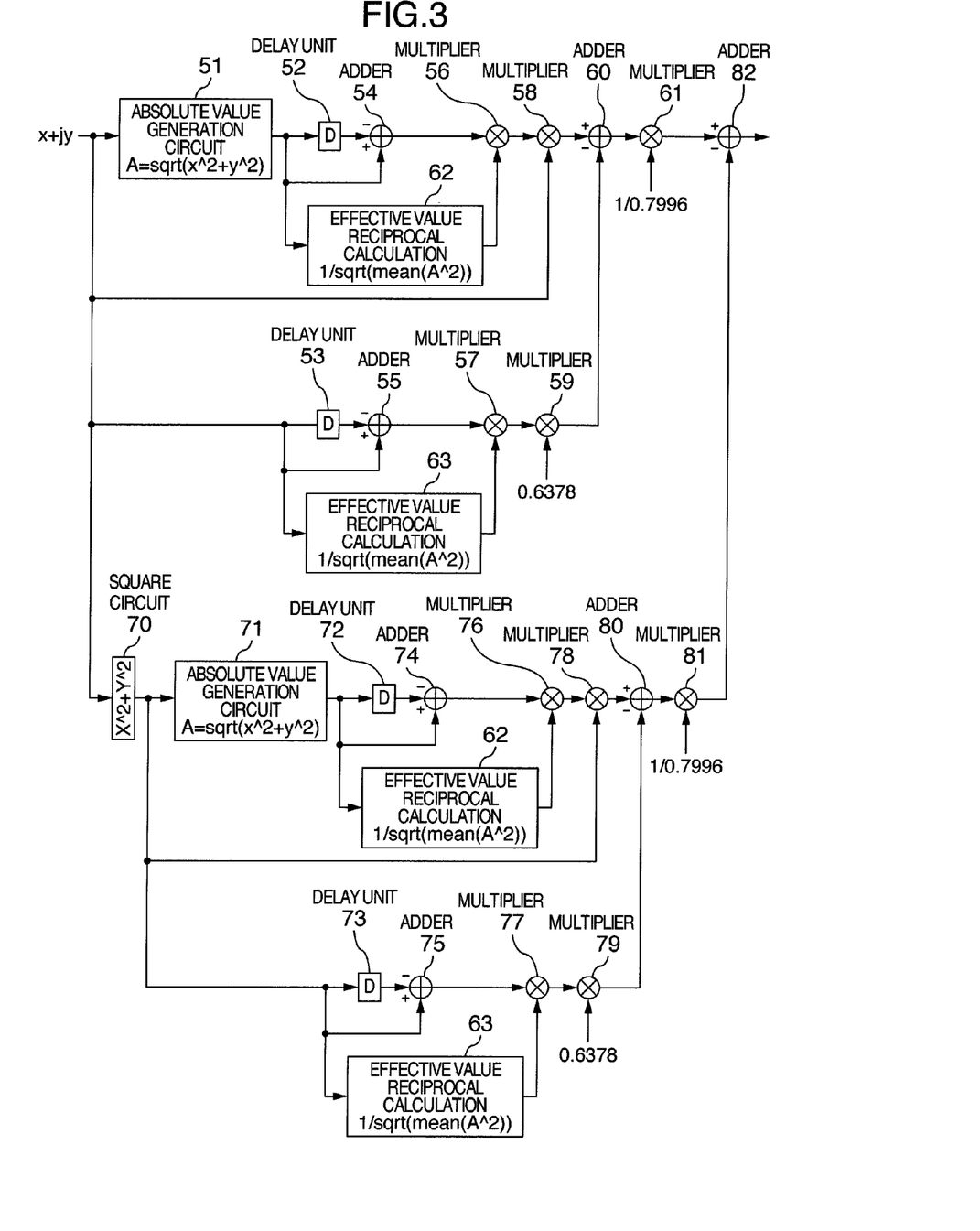
FIG. 3 is a block diagram showing an even symmetry distortion signal generation circuit according to an embodiment of the present invention (with square added).

In FIG. 3 which is a block diagram (with square added) showing an odd-symmetrical distortion signal generation circuit according to an embodiment of the present invention, not only the even-symmetrical distortion of the amplitude differential and phase differential of a square signal but also the even-symmetrical distortion of the amplitude differential and phase differential of the fourth-order signal is detected and compensation is conducted by using two sets of the circuit shown in FIG. 2A which is a block diagram (with amplitude differential and phase differential) showing the odd-symmetrical distortion signal generation circuit according to an embodiment of the present invention and a square circuit 70 as shown in FIG. 3 which is a block diagram (with square added) showing the odd-symmetrical distortion signal generation circuit according to an embodiment of the present invention.

The present invention is not restricted to the first embodiment or the second embodiment, but can be applied widely to predistortion compensation circuits which independently generate coefficients of odd-symmetrical distortion compensation signals of respective orders of a high-frequency power amplifier for power-amplifying an input signal frequency-converted into a high-frequency band or an input signal in the high-frequency band and which generate a plurality of coefficients of an even-symmetrical distortion compensation signal of a differential of the input signal before frequency conversion into the high-frequency band or the input signal in the high-frequency band, respectively independently and independently of the odd-symmetrical distortion compensation signals.

REFERENCE SIGNS LIST

1: OFDM modulator (digital output), 44: OFDM modulator (analog output)
4: orthogonal modulator,
5: D/A converter (DAC),
16, 43: orthogonal demodulator,
11, 40: mixer, 6, 9, 12: BPF, 13: oscillator,
14, 41: A/D converter (ADC), 15, 42: variable amplifier (AGC),
7: high-frequency power amplifier (power amplifier), 8: directional coupler, 10: antenna,
2, 21, 24, 30, 34, 56, 57, 58, 59, 61, 69, 76, 77, 78, 79, 81: multiplier,
3, 22, 25, 54, 55, 60, 74, 75, 80, 82: adder,
20, 29: odd-symmetrical distortion signal generation circuit,
23, 32: even-symmetrical distortion signal generation circuit,
36: odd-symmetrical distortion superposition (multiplication) circuit,
37: even-symmetrical distortion superposition (addition) circuit,
38: distortion compensation circuit with modulator incorporated,
39, 47: distortion compensation signal generation circuit,
19, 28, 70: square circuit, 51, 71: absolute value generation circuit,
62, 63, 67: effective value reciprocal calculation circuit,
17: phase shifter, 45, 46: variable delay unit, 52, 53, 72, 73: delay unit,
26, 33: conjugation unit (CONJ),
31, 35, 65: averaging circuit,
66: circuit for automatically calculating fixed value 0.6378,
68: circuit for automatically calculating fixed value 0.7996.

The invention claimed is:

1. A distortion compensation circuit comprising:
a distortion compensation signal generation circuit for independently generating odd-symmetrical distortion compensation signals of respective orders of a high-frequency power amplifier which power-amplifies an input signal frequency-converted into a high-frequency band;
a distortion compensation signal superposition circuit for superposing the generated odd-symmetrical distortion compensation signals of respective orders on the input signal obtained before the frequency conversion to the high frequency band;
an even-symmetrical distortion compensation signal generation circuit for obtaining a difference between an amplitude of the input signal and that obtained one sample before and a difference between the input signal and that obtained one sample before, and generating an even-symmetrical amplitude distortion compensation signal and an even-symmetrical phase distortion compensation signal on the basis of the difference between the amplitude of the input signal and that obtained one sample before and the difference between the input signal and that obtained one sample before, respectively independently and independently of the odd-symmetrical distortion compensation signals; and
an even-symmetrical distortion compensation signal superposition circuit for superposing the generated even-symmetrical distortion compensation signals on the input signal,
odd-symmetrical distortion and even-symmetrical distortion being compensated independently.

2. A transmitter using the distortion compensation circuit and the high-frequency power amplifier according to claim 1.

3. A distortion compensation circuit comprising:
a distortion compensation signal generation circuit for independently generating odd-symmetrical distortion compensation signals of respective orders of a high-frequency power amplifier which power-amplifies an input signal frequency-converted into a high-frequency band;
a distortion compensation signal superposition circuit for superposing the generated odd-symmetrical distortion compensation signals of respective orders on the input signal obtained before the frequency conversion to the high frequency band;
an even-symmetrical distortion compensation signal generation circuit for obtaining a first difference between an amplitude of the input signal and that obtained one sample before and multiplying the first difference on the input signal to generate a first signal, obtaining the difference between the amplitude of the input signal and that obtained one sample before and a second difference between the input signal and that obtained one sample before and multiplying the first and second differences to generate a second signal, adding the first signal and the second signal to generate an even-symmetrical distortion compensation signal, and generating an even-symmetrical amplitude distortion compensation signal and an even-symmetrical phase distortion compensation signal on the basis of the first difference and the second difference, respectively independently and independently of the odd-symmetrical distortion compensation signals and conducting a linear combination on the generated even-symmetrical distortion compensation signals; and an even-symmetrical distortion compensation signal superposition circuit for superposing the even-symmetrical distortion compensation signals subjected to the linear combination on the input signal, odd-symmetrical distortion and even-symmetrical distortion being compensated independently.

4. A transmitter using the distortion compensation circuit and the high-frequency power amplifier according to claim 3.

* * * * *